United States Patent [19]

Lusk

[11] Patent Number: 4,520,428

[45] Date of Patent: May 28, 1985

[54] DENSE PACKAGING SYSTEM FOR PRINTER WIRING BOARDS

[75] Inventor: Kenneth P. Lusk, Ridgecrest, Calif.

[73] Assignee: The United State of America as represented by the Secretary of the Navy, Washington, D.C.

[21] Appl. No.: 576,295

[22] Filed: Feb. 2, 1983

[51] Int. Cl.³ .............................................. H05K 1/14
[52] U.S. Cl. .................................. 361/399; 361/415; 211/41
[58] Field of Search ................ 174/52 R; 339/17 LM, 339/17 M, 17 N; 211/41; 361/331, 380, 392–396, 399, 412, 415, 417, 419, 420, 429; 206/328, 334, 454; 220/22, 3

[56] References Cited

U.S. PATENT DOCUMENTS

| | | | |
|---|---|---|---|
| 3,169,214 | 2/1965 | Whitehorn | 317/99 |
| 3,257,585 | 6/1966 | Ransom | 361/412 |
| 3,539,874 | 11/1970 | Swanson | 174/52 R |
| 3,596,139 | 7/1971 | Walsh | 317/101 R |
| 3,596,140 | 7/1971 | Walsh | 317/101 DH |
| 3,755,891 | 9/1973 | Muckelroy et al. | 29/628 |
| 3,848,953 | 11/1974 | Petroshanoff | 339/92 M |
| 3,951,490 | 4/1976 | Devendorf | 339/17 C |
| 4,051,414 | 9/1977 | Will | 361/419 |

FOREIGN PATENT DOCUMENTS

| | | | |
|---|---|---|---|
| 52439 | 12/1966 | German Democratic Rep. | 361/415 |
| 422937 | 4/1967 | Switzerland | 361/415 |

*Primary Examiner*—G. P. Tolin
*Attorney, Agent, or Firm*—Robert F. Beers; W. Thom Skeer; Thomas W. Hennen

[57] ABSTRACT

A packaging system for securely mounting electronic components within a housing including at least a pair of bulkheads in combination with support plates having transversely extending grooves across a surface of the support plates and interlocking support plates having transversely extending interrupted grooves across a surface of interlocking support plates, said grooves and interrupted grooves engage with the edges of the electronic components to achieve the secure mounting.

1 Claim, 1 Drawing Figure

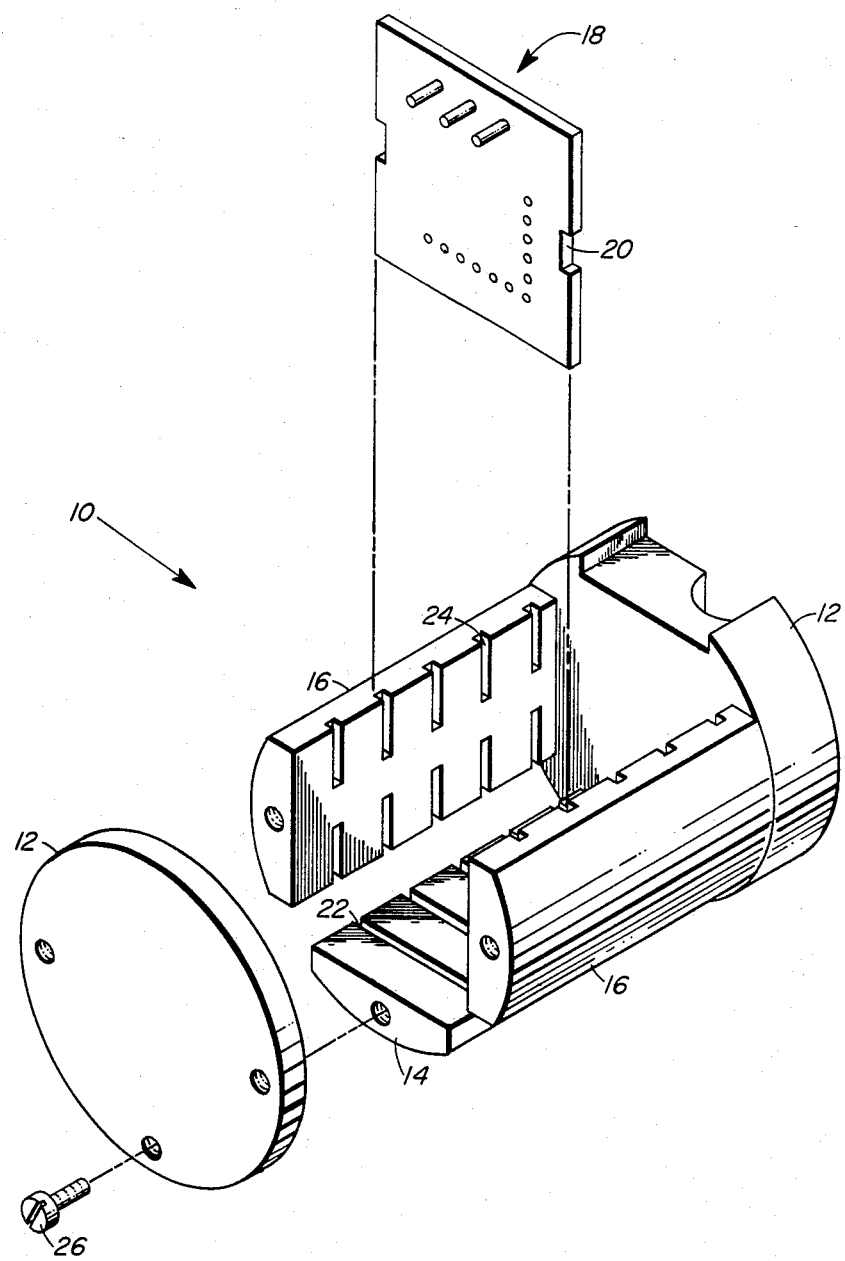

DENSE PACKAGING SYSTEM FOR PRINTER WIRING BOARDS

BACKGROUND OF THE INVENTION

1. Field of the Invention

The present invention relates to packaging systems. In particular, this invention relates to dense packaging systems for holding and protecting electronic components, i.e. printed circuit boards, from high gravitational and vibrational environments.

2. Description of the Prior Art

Telemetry systems in airborne missiles can require the packaging and assembly of several printed circuit boards into a small volume. The entire assembly must be secured to protect the boards from vibrational and gravitational extremes during flight. Packaging systems must provide secure mountings of the printed circuit boards. Previous packaging methods have had four peripheral structures to surround and hold a printed circuit board on all sides. The edges of a printed circuit board would be engaged within grooves or channels in the peripheral structures.

SUMMARY OF THE INVENTION

This invention provides a dense packaging system for mounting components securely within a housing. The system includes a plurality of bulkheads, a support plate with a traversely extending groove in a surface of said support plate, an interlocking support plate with a traversely extending interrupted groove in the surface of said interlocking support plate, and a means for attaching said support plates between said bulkheads. The edges of a component will engage with the grooves and interrupted grooves to secure said component.

OBJECTS OF THE INVENTION

It is an object of this invention to provide a packaging system for the mounting of electronic components within a housing.

Another object of the invention is to provide a packaging system which protects the electronic components from high vibrational and gravitational forces.

Still another object of the invention is to provide a packaging system allowing for rapid assembly and disassembly of the system and the electronic components.

These and other objects of the invention will become more readily apparent from the following detailed description when taken together with the drawing.

BRIEF DESCRIPTION OF THE DRAWING

The FIGURE is an exploded perspective view of the packaging system of this invention.

DETAILED DESCRIPTION OF THE PREFERRED EMBODIMENT

The FIGURE shows a packaging system 10 which will securely mount components within a housing. System 10 has a configuration to fit within the required housing or volume of the particular application. System 10 includes bulkheads 12 having an outer circumference corresponding to the inner face of the housing. Between bulkheads 12 are located a support plate 14 and support plate 16. Support plate 14 has a face for alignment with the inner face of the housing and a planar face having continuous grooves 22 extending traversely across the surface of the planar face. Continuous grooves 22 are aligned parallel to bulkheads 12. Interlocking support plate 16 has a face for alignment with the inner face of the housing and a planar face having interrupted grooves 24 extending traversely in the surface of the planar face. Interrupted grooves 24 and continuous grooves 22 define planes parallel to the surface of bulkheads 12. Screws 26 serve to attach the support plate and the interlocking support plates to bulkheads 12. Any convenient means for attaching the support plates would be suitable. However, ease in disassembly and reassembly will limit the choices.

In assembly the electronic component 18 having notches 20 will be inserted within a continuous groove 22 of support plate 14 and the interrupted groove 24 of support plate 16. Notch 20 will engage with interrupted groove 24 to securely lock the electronic component within the packaging system 10.

In a telemetry system for use with an airborne missile, the volume or housing of the missile will be cylindrical. The bulkheads would have radii corresponding to the inner radius of the housing and the support plates would have a convex face for alignment with this interface of the housing. As seen in the FIGURE there is one continuously grooved support plate and a pair of interrupted grooved support plates between the bulkheads. The removal of one interrupted groove support plate allows for the removal of the electronic component or printed circuit board. When the printed circuit board is placed with the grooves and the two interrupted grooved support plates and the additional grooved support plate are in position the notches in the electronic component keep the board in place.

Obviously many modifications and variations of the present invention are possible in light of the above teachings. It is therefore understood that within the scope of the appended claims, the invention may be practiced otherwise than as specifically described.

What is claimed is:

1. A packaging system for transversely mounting at least one printed wiring board within a cylindrical housing, comprising:

at least two parallel, spaced apart bulkheads having an outer circumference;

at least one support plate extending between said bulkheads, said support plate being removably attached to each of said bulkheads at the periphery of each of said bulkheads, and having a planar face oriented toward the volume between said bulkheads and defining at least one transversely extending uninterrupted groove;

two interlocking plates extending between said bulkheads, each of said interlocking plates being removably attached to each of said bulkheads, at the periphery of said bulkheads, each interlocking plate having a planar face oriented perpendicularly to the planar face of said support plate and parallel to the planar face of the other interlocking plate, and defining at least one transversely extending interrupted groove in said planar face, said interrerpted groove having solid material between spaced adjacent inner ends, said interrupted groove being coplanar with said groove in said support plate; and at least one rectangular printed wiring board having a slot in each of two opposite edges corresponding to the space between said abutting ends of said interrupted grooves, in each of said interlocking plates, and uninterrupted edges on the other two edges of said printed wiring board, said rectangular printed wiring board being inserted edgewise in said groove in said support plate, and being inserted edgewise in said interrupted grooves in said interlocking plates;

whereby removal of only one of said interlocking plates enables slidable removal of said rectangular printed wiring board.

* * * * *